United States Patent
Ambardekar et al.

(10) Patent No.: US 11,100,391 B2
(45) Date of Patent: Aug. 24, 2021

(54) POWER-EFFICIENT DEEP NEURAL NETWORK MODULE CONFIGURED FOR EXECUTING A LAYER DESCRIPTOR LIST

(71) Applicant: Microsoft Technology Licensing, LLC, Redmond, WA (US)

(72) Inventors: Amol Ashok Ambardekar, Redmond, WA (US); Kent D. Cedola, Bellevue, WA (US); Larry Marvin Wall, Seattle, WA (US); Boris Bobrov, Kirkland, WA (US); George Petre, Redmond, WA (US); Chad Balling McBride, North Bend, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 806 days.

(21) Appl. No.: 15/951,106

(22) Filed: Apr. 11, 2018

(65) Prior Publication Data
US 2018/0300614 A1    Oct. 18, 2018

Related U.S. Application Data

(60) Provisional application No. 62/486,432, filed on Apr. 17, 2017.

(51) Int. Cl.
*G06N 3/063*    (2006.01)
*G06N 3/04*    (2006.01)
(Continued)

(52) U.S. Cl.
CPC ............ *G06N 3/063* (2013.01); *G06F 1/324* (2013.01); *G06F 1/3275* (2013.01);
(Continued)

(58) Field of Classification Search
CPC .... G06F 13/1673; G06F 1/324; G06F 3/0604; G06F 3/0631; G06F 3/067; G06F 9/3887;
(Continued)

(56) References Cited

U.S. PATENT DOCUMENTS

| 4,298,954 A | 11/1981 | Bigelow et al. |
| 5,091,864 A | 2/1992 | Baji et al. |

(Continued)

FOREIGN PATENT DOCUMENTS

| EP | 0147857 A2 | 7/1985 |
| EP | 2945290 A2 | 11/2015 |

(Continued)

OTHER PUBLICATIONS

"Non Final Office Action Issued in U.S. Appl. No. 15/702,311", dated Jun. 29, 2018, 10 pages.
(Continued)

*Primary Examiner* — Ajay Ojha
(74) *Attorney, Agent, or Firm* — Newport IP, LLC; Leonard J. Hope

(57) ABSTRACT

A deep neural network (DNN) processor is configured to execute descriptors in layer descriptor lists. The descriptors define instructions for performing a pass of a DNN by the DNN processor. Several types of descriptors can be utilized: memory-to-memory move (M2M) descriptors; operation descriptors; host communication descriptors; configuration descriptors; branch descriptors; and synchronization descriptors. A DMA engine uses M2M descriptors to perform multi-dimensional strided DMA operations. Operation descriptors define the type of operation to be performed by neurons in the DNN processor and the activation function to be used by the neurons. M2M descriptors are buffered separately from operation descriptors and can be executed at soon as possible, subject to explicitly set dependencies. As
(Continued)

a result, latency can be reduced and, consequently, the neurons can complete their processing faster. The DNN module can then be powered down earlier than it otherwise would have, thereby saving power.

20 Claims, 8 Drawing Sheets

(51) Int. Cl.

| | |
|---|---|
| *G06F 12/0862* | (2016.01) |
| *G06F 9/46* | (2006.01) |
| *G06F 1/324* | (2019.01) |
| *G06F 3/06* | (2006.01) |
| *G06F 9/38* | (2018.01) |
| *G06F 12/08* | (2016.01) |
| *G06F 12/10* | (2016.01) |
| *G06F 15/80* | (2006.01) |
| *G06F 17/15* | (2006.01) |
| *G06N 3/06* | (2006.01) |
| *G06N 3/08* | (2006.01) |
| *G06N 3/10* | (2006.01) |
| *H03M 7/30* | (2006.01) |
| *H04L 12/715* | (2013.01) |
| *H04L 29/08* | (2006.01) |
| *G06F 9/30* | (2018.01) |
| *G06F 13/16* | (2006.01) |
| *G06F 1/3234* | (2019.01) |
| *G06F 12/02* | (2006.01) |
| *G06F 13/28* | (2006.01) |
| *H03M 7/46* | (2006.01) |
| *H04L 12/723* | (2013.01) |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(58) Field of Classification Search
CPC ...... G06F 12/08; G06F 12/10; G06F 15/8007; G06F 17/15; G06F 2212/657; G06F 2209/485; G06F 2209/484; G06F 1/3287; G06F 1/3206; G06F 9/4881; G06F 9/5061; G06F 9/5016; G06F 9/467; G06F 2212/1016; G06F 2212/6026; G06F 9/5077; G06F 9/5033; G06F 12/0862; G06F 9/46; G06F 1/3275; G06F 12/0207; G06F 13/1689; G06F 13/28; G06N 3/049; G06N 3/06; G06N 3/0635; G06N 3/08; G06N 3/10; G06N 3/0454; G06N 3/04; G06N 3/063; H03M 7/46; H03M 7/6058; H03M 7/3059; H03M 7/3066; H03M 7/6005; H03M 7/6011; H03M 7/70; H04L 45/50; H04L 45/04; H04L 67/02; H04L 67/1002; Y02D 30/50; Y02D 10/00
See application file for complete search history.

(56) References Cited

U.S. PATENT DOCUMENTS

| | | | |
|---|---|---|---|
| 5,487,153 | A | 1/1996 | Hammerstrom et al. |
| 5,524,175 | A | 6/1996 | Sato et al. |
| 5,644,749 | A | 7/1997 | Obayashi |
| 5,859,990 | A | 1/1999 | Yarch |
| 5,933,654 | A | 8/1999 | Galdun et al. |
| 6,307,867 | B1 | 10/2001 | Roobol et al. |
| 6,654,730 | B1 | 11/2003 | Kato et al. |
| 6,785,239 | B1 | 8/2004 | Tasker |
| 6,990,079 | B2 | 1/2006 | Vrabel |
| 7,012,893 | B2 | 3/2006 | Bahadiroglu |
| 7,480,640 | B1 | 1/2009 | Elad et al. |
| 7,539,608 | B1 | 5/2009 | Dageville et al. |
| 7,694,084 | B2 | 4/2010 | Raghavan et al. |
| 8,244,953 | B1 | 8/2012 | Kumar |
| 8,442,927 | B2 | 5/2013 | Chakradhar et al. |
| 8,892,488 | B2 | 11/2014 | Qi et al. |
| 8,966,413 | B2 | 2/2015 | Shacham et al. |
| 9,015,096 | B2 | 4/2015 | Hunzinger |
| 9,143,393 | B1 | 9/2015 | Bird et al. |
| 9,378,044 | B1 | 6/2016 | Gaurav et al. |
| 9,851,771 | B2 | 12/2017 | Cooper et al. |
| 9,990,307 | B1 | 6/2018 | Patel et al. |
| 10,275,001 | B2 | 4/2019 | Kam et al. |
| 2002/0133648 | A1 | 9/2002 | Goudie et al. |
| 2003/0065631 | A1 | 4/2003 | Mcbride |
| 2003/0120799 | A1 | 6/2003 | Lahav et al. |
| 2003/0200315 | A1 | 10/2003 | Goldenberg et al. |
| 2004/0187135 | A1 | 9/2004 | Pronovost et al. |
| 2005/0204189 | A1 | 9/2005 | Akiba |
| 2005/0216616 | A1 | 9/2005 | Eldar et al. |
| 2006/0047864 | A1 | 3/2006 | Brokenshire et al. |
| 2007/0145151 | A1 | 6/2007 | Nakamura et al. |
| 2008/0043742 | A1 | 2/2008 | Pong et al. |
| 2008/0052441 | A1 | 2/2008 | Freking et al. |
| 2008/0112438 | A1 | 5/2008 | Ying et al. |
| 2008/0313385 | A1 | 12/2008 | Vijayakumar et al. |
| 2008/0319933 | A1 | 12/2008 | Moussa et al. |
| 2009/0037697 | A1 | 2/2009 | Ramani et al. |
| 2009/0313195 | A1 | 12/2009 | McDaid et al. |
| 2010/0180100 | A1 | 7/2010 | Lu et al. |
| 2010/0257174 | A1 | 10/2010 | Minuti |
| 2010/0281192 | A1 | 11/2010 | Rakib et al. |
| 2011/0246722 | A1 | 10/2011 | Taha et al. |
| 2012/0130928 | A1 | 5/2012 | Bell et al. |
| 2012/0134449 | A1 | 5/2012 | Chen et al. |
| 2014/0046882 | A1 | 2/2014 | Wood |
| 2014/0181464 | A1 | 6/2014 | Forsyth et al. |
| 2014/0281221 | A1 | 9/2014 | Wang et al. |
| 2014/0372670 | A1 | 12/2014 | Vasilyuk |
| 2015/0363239 | A1 | 12/2015 | Hsu et al. |
| 2016/0098388 | A1 | 4/2016 | Blevins et al. |
| 2016/0184587 | A1 | 6/2016 | Heuvel et al. |
| 2016/0267377 | A1 | 9/2016 | Pan et al. |
| 2016/0328644 | A1 | 11/2016 | Lin et al. |
| 2016/0335119 | A1 | 11/2016 | Merrill et al. |
| 2016/0350653 | A1 | 12/2016 | Socher et al. |
| 2016/0371537 | A1* | 12/2016 | He ................... G06K 9/00228 |
| 2017/0011288 | A1 | 1/2017 | Brothers et al. |
| 2017/0199902 | A1* | 7/2017 | Mishra ................. G06N 5/003 |
| 2018/0299943 | A1 | 10/2018 | Mcbride et al. |
| 2018/0300601 | A1 | 10/2018 | Cedola et al. |
| 2018/0300602 | A1 | 10/2018 | Petre et al. |
| 2018/0300603 | A1 | 10/2018 | Ambardekar et al. |
| 2018/0300604 | A1 | 10/2018 | Mcbride et al. |
| 2018/0300605 | A1 | 10/2018 | Ambardekar et al. |
| 2018/0300606 | A1 | 10/2018 | Corkery et al. |

(56) References Cited

U.S. PATENT DOCUMENTS

| | | |
|---|---|---|
| 2018/0300607 A1 | 10/2018 | Petre et al. |
| 2018/0300613 A1 | 10/2018 | Petre et al. |
| 2018/0300615 A1 | 10/2018 | Ambardekar et al. |
| 2018/0300616 A1 | 10/2018 | Ambardekar et al. |
| 2018/0300617 A1 | 10/2018 | Mcbride et al. |
| 2018/0300633 A1 | 10/2018 | Mcbride et al. |
| 2018/0300634 A1 | 10/2018 | Mcbride et al. |
| 2020/0233820 A1 | 7/2020 | Mcbride et al. |

FOREIGN PATENT DOCUMENTS

| | | |
|---|---|---|
| EP | 3035204 A1 | 6/2016 |
| EP | 3035249 A1 | 6/2016 |
| WO | 1993014459 A1 | 7/1993 |
| WO | 2016118257 A1 | 7/2016 |
| WO | 2016210030 A1 | 12/2016 |

OTHER PUBLICATIONS

"International Search Report and Written Opinion Issued in PCT Application No. PCT/US2018/026358", dated Jul. 11, 2018, 15 Pages.

"International Search Report and Written Opinion Issued in PCT Application No. PCT/US2018/026352", dated Jun. 27, 2018, 11 Pages.

"International Search Report and Written Opinion Issued in PCT Application No. PCT/US2018/026353", dated Jul. 6, 2018, 15 Pages.

"International Search Report and Written Opinion Issued in PCT Application No. PCT/US2018/026354", dated Jul. 31, 2018, 15 Pages.

"International Search Report and Written Opinion Issued in PCT Application No. PCT/US2018/026355", dated Jul. 9, 2018, 16 Pages.

"International Search Report and Written Opinion Issued in PCT Application No. PCT/US2018/026356", dated Jul. 6, 2018, 16 Pages.

"International Search Report and Written Opinion Issued in PCT Application No. PCT/US2018/026357", dated Jul. 9, 2018, 16 Pages.

"Non Final Office Action Issued in U.S. Appl. No. 15/702,311", dated May 21, 2019, 12 Pages.

"Ex Parte Quayle Action Issued in U.S. Appl. No. 15/950,644", Mailed Date: Sep. 23, 2019, 7 Pages.

"Final Office Action Issued in U.S. Appl. No. 15/702,311", dated Nov. 5, 2018, 12 Pages.

"International Search Report & Written Opinion Issued in PCT Patent Application No. PCT/US18/027674", dated Jul. 13, 2018, 13 Pages.

"International Search Report & Written Opinion Issued in PCT Patent Application No. PCT/US18/027680", dated Sep. 27, 2018, 13 Pages.

"International Search Report & Written Opinion Issued in PCT Patent Application No. PCT/US18/027828", dated Aug. 3, 2018, 11 Pages.

"International Search Report & Written Opinion Issued in PCT Patent Application No. PCT/US18/027834", dated Jul. 24, 2018, 11 Pages.

"International Search Report & Written Opinion Issued in PCT Patent Application No. PCT/US18/027836", dated Aug. 3, 2018, 14 Pages.

"International Search Report & Written Opinion Issued in PCT Patent Application No. PCT/US18/027837", dated Aug. 3, 2018, 10 Pages.

"International Search Report & Written Opinion Issued in PCT Patent Application No. PCT/US18/027840", dated Jul. 30, 2018, 9 Pages.

"Notice of Allowance Issued in U.S. Appl. No. 15/702,311", dated Sep. 11, 2019, 6 Pages.

Chi, et al., "PRIME: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.

"Notice of Allowance Issued in U.S. Appl. No. 15/694,663", dated May 8, 2020, 9 Pages.

* cited by examiner

POWER-EFFICIENT DEEP NEURAL NETWORK MODULE CONFIGURED FOR EXECUTING A LAYER DESCRIPTOR LIST

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power, and reduced power in POE devices like security cameras results in lower power consumption and cost of POE switches.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

It is with respect to these and other technical challenges that the disclosure made herein is presented.

SUMMARY

A neural network module, or processor, is disclosed that can execute descriptors in a layer descriptor list in a manner that reduces latency during the performance of DNN calculations. Reduced latency during processing of DNN calculations using the disclosed technologies can result in reduced power consumption. Other technical benefits not specifically mentioned herein can also be realized through implementations of the disclosed subject matter.

In order to realize the technical benefits mentioned briefly above, and potentially others, a DNN module is disclosed that is capable of retrieving and executing descriptors contained in layer descriptor lists in order to implement DNNs. Layer descriptor lists (which might be referred to herein as "descriptor lists") are pre-compiled by software, such as a compiler, and include instructions for performing a forward pass and/or a backward propagation of a neural network by the DNN module.

The descriptors in a descriptor list can also be utilized to configure aspects of the operation of the DNN module, including configuration of the neurons in the DNN module for implementing a neural network. In one embodiment, descriptor lists are stored in the main memory of a computing device acting as a host for the DNN module and loaded by the DNN module for on-the-fly execution.

Descriptor lists can include several types of DNN layer descriptors (which may be referred to herein as "descriptors"): memory-to-memory move ("M2M") descriptors; operation descriptors; host communication descriptors; configuration descriptors; branch descriptors; and synchronization descriptors. Each of these descriptor types are described below.

In one embodiment, a direct memory access ("DMA") engine in the DNN module utilizes M2M descriptors to perform DMA operations. To enable this functionality, M2M descriptors include fields specifying parameters defining a multi-dimensional strided DMA operation to and from any memory address. For example, and without limitation, a M2M descriptor can be executed to transfer input data and weight data to be operated on by neurons in the DNN module from a memory of a host computing device to a memory in the DNN module, such as a buffer memory. M2M descriptors include data that defines the parameters of such a memory transfer.

Operation descriptors define a specific operation that neurons in the DNN module should perform on data obtained by a M2M descriptor. For example, operation descriptors can define the arithmetic operations to be performed by neurons such as, but not limited to, additive combining, scalar multiply and add, convolution, deconvolution, max pooling, or a fully connected layer.

Operation descriptors can also specify the activation function to be used by the neurons, such as but not limited to the ReLU activation function and look-up table-based activation functions, and the mathematical precision to be utilized by the neurons. Operation descriptors can also include microcode for configuring aspects of the operation of the hardware of the DNN module. Operation descriptors can include other fields containing data defining aspects of the configuration of the neurons for implementing a DNN, some of which are described below.

Host communication descriptors enable the DNN module to interrupt and/or signal a host computing device to provide status messages and/or other types of data. For example, the DNN module might execute a host communication descriptor to provide data to a host computing device regarding the status or completion of a layer of a DNN.

Configuration descriptors enable the modification of a configuration state of the DNN module. For example, configuration descriptors can be executed to configure how the DNN module performs rounding operations, power management, or enabling and disabling neurons.

Branch descriptors enable branching between descriptor lists when a specified condition is satisfied. Synchronization descriptors can be utilized to synchronize the execution of multiple neurons by instructing the neurons to pause their processing until the other neurons of a neural network have completed their processing. Other types of descriptors can be defined and executed in other embodiments.

In one embodiment, the DNN module retrieves a layer descriptor list from the main memory of a host computing device. The layer descriptor list might then be stored, for example, in a buffer memory of the DNN module. The DNN module then begins executing descriptors in the descriptor list. For example, and without limitation, a M2M descriptor might be executed to obtain data, such as input data and weight data for a DNN, to be operated on by the neurons in the DNN module. This data might also be stored in a buffer for use by the neurons.

Once a descriptor (e.g. an M2M descriptor) has been executed, the DNN module will execute the next descriptor in the layer descriptor list. For instance, the DNN module might execute an operation descriptor. Upon execution, the operation descriptor will cause the neurons to be configured such as, for example, by configuring the neurons to perform the operation type specified in the operation descriptor (e.g. additive combining, scalar multiply and add, convolution, deconvolution, etc.) and configuring the type of activation function to be used by the neurons. Once configured, the neurons can process the data retrieved through the execution of the M2M descriptor in the manner defined by the operation descriptor. This process can be repeated for additional descriptors such as those described above and additional layer descriptor lists.

As will be described in greater detail below, M2M descriptors are buffered separately from operation descriptors and can be executed at soon as possible, subject to explicitly set dependencies. As a result, the latency typically incurred in obtaining data for processing by neurons in a DNN module can be reduced and, consequently, the neurons can complete their processing faster than they otherwise would have. The DNN module can then be powered down earlier than it otherwise would have, thereby saving power. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
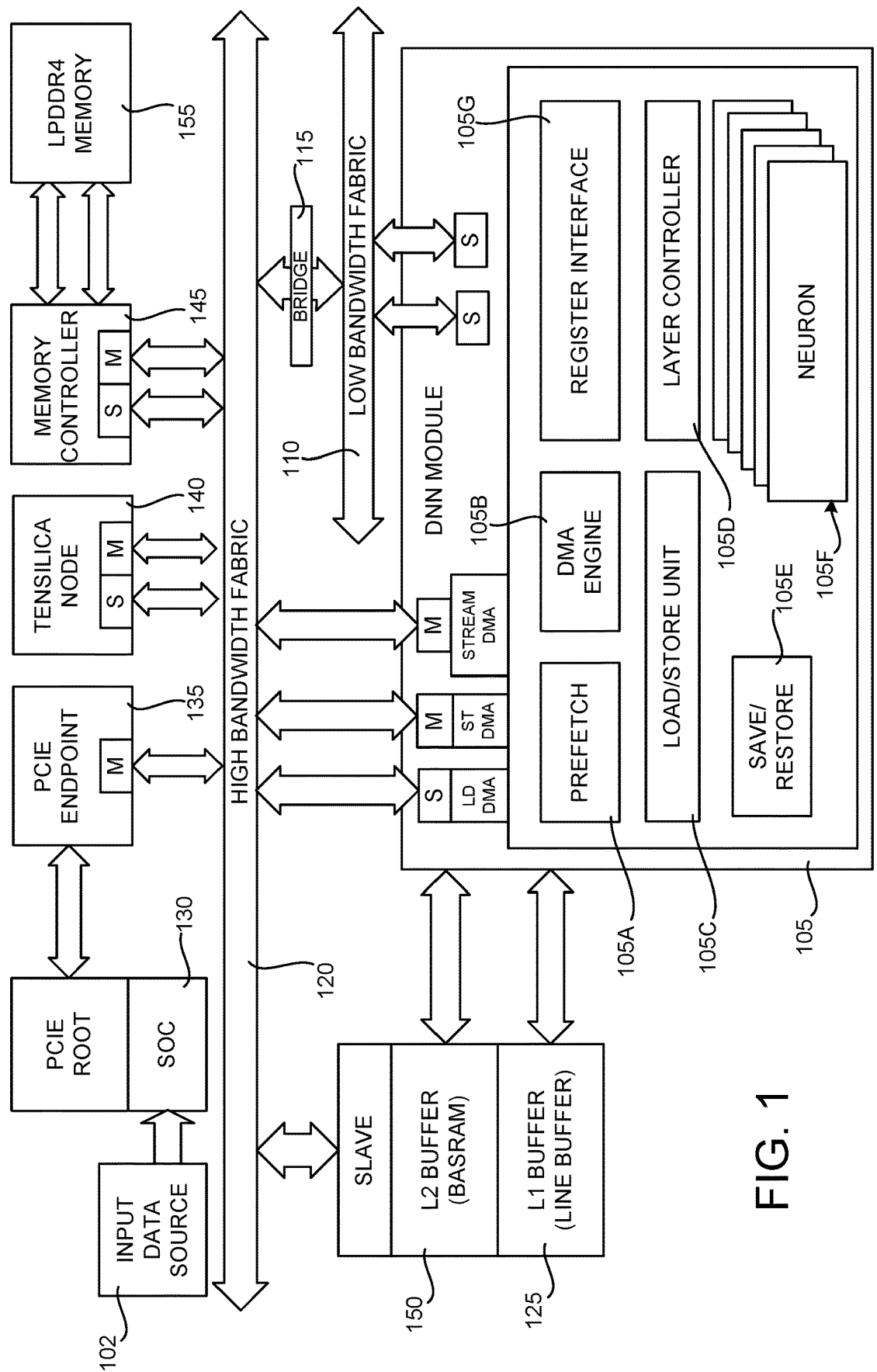
FIG. 1 is a computing architecture diagram that shows aspects of the configuration and operation of a DNN module that can implement the technologies disclosed herein, according to one embodiment.

The following detailed description is directed to a neural network module that can execute descriptors in a layer descriptor list to efficiently perform DNN calculations. As discussed briefly above, efficient processing of DNN calculations using the disclosed technologies can also lead to reduced power consumption. Other technical benefits not specifically mentioned herein can also be realized through implementations of the disclosed subject matter.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a neural network module that can execute descriptors in a layer descriptor list to efficiently perform DNN calculations will be described.

FIG. 1 is a computing architecture diagram that shows aspects of the configuration and operation of a deep neural network ("DNN") module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F are able to maintain context for multiple different active kernels at a time. Each accumulator is capable of being loaded from a read of the BaSRAM 150 (described below). The accumulators can sum themselves with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the term activation data is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, a non-linear function, step function, or another type of function. The activation function allows the neurons 105F to train to a larger set of inputs and desired outputs.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Multiple types of descriptors can be utilized including, but not limited to, memory-to-memory move ("M2M") descriptors and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operation descriptors include data defining a specific operation that the neurons 105F should perform on a data structure located in local static random access memory ("SRAM") memory or another type of high performance local memory including, but not limited to, Magnetoresistive RAM ("MRAM"). The operation descriptors are processed in order and are capable of many different layer operations, at least some of which are described herein. Additional details regarding the M2M descriptors, the operation descriptors, and several other types of descriptors along with mechanisms for executing the descriptors will be provided below with regard to FIGS. 2-6.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity with a high speed private interface operating at a selected frequency. The L1 buffer 125 can maintain a selected storage capacity that can be split between kernel and activation data. The L1 buffer 125 might be referred to herein as the "line buffer 125," and the L2 buffer 150 might be referred to herein as the BaSRAM 150.

Computational data (i.e. input data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105 in some embodiments. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 2:
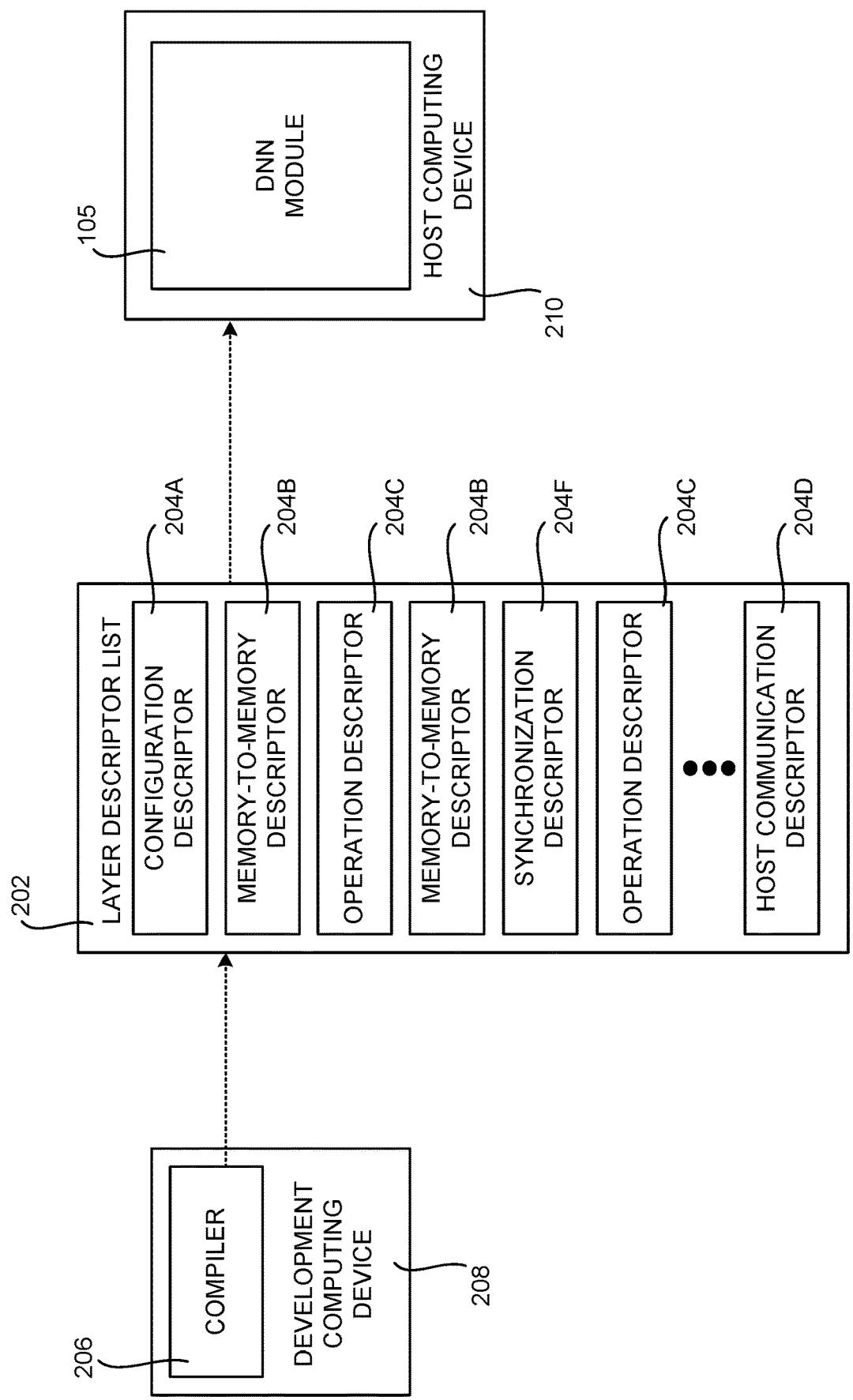
FIG. 2 is a computing system diagram that shows aspects of an illustrative environment for creating and executing a layer descriptor list, according to one embodiment.

FIG. 2 is a computing system diagram that shows aspects of an illustrative environment for creating and executing a layer descriptor list 202, according to one embodiment. As described briefly above, the DNN module 105 can retrieve and execute layer descriptors 204 contained in a layer descriptor list 202 to implement a DNN.

Layer descriptor lists 202 are pre-compiled by software, such as a compiler 206 executing on a development computing device 208, and correspond to the layers of a neural network. Layer descriptor lists 202 can be created on a development computing device 208, or in another environment, and deployed to the device 210 hosting the DNN module 105 (which might be referred to herein as the "host 210"). The DNN module 105 treats the layer descriptors 204 as instructions and can execute the layer descriptors 204 to perform a forward pass of a neural network.

In one embodiment, layer descriptor lists 202 are stored in the main memory of a computing device 210 acting as a host for the DNN module 105 and loaded by the DNN module for on-the-fly execution. The descriptors 204 can be pre-fetched from host 210 memory into the DNN module 105 and executed in order.

Layer descriptor lists 204 can include several types of DNN layer descriptors 204: memory-to-memory move ("M2M") descriptors 204B; operation descriptors 204C; host communication descriptors 204D; configuration descriptors 204A; branch descriptors 204E (shown in FIG. 3 and described below); and synchronization descriptors 204F. Each of these descriptor types are described below. Other types of layer descriptors can be utilized in other embodiments.

M2M descriptors 204B can be used to move data to/from the main memory of the host computing device 210 to/from a local buffer (i.e. the line buffer 125 described below) for consumption by the operation descriptors, described below. In one embodiment, a direct memory access ("DMA") engine (not shown in FIG. 1) in the DNN module 105 utilizes M2M descriptors 204B to perform DMA operations.

M2M descriptors 204B include fields specifying parameters defining a multi-dimensional strided DMA operation to and from any memory address. For example, and without limitation, a M2M descriptor can be executed to transfer input data and weight data to be operated on by neurons 105F in the DNN module 105 from a memory of the host computing device 210 to a memory in the DNN module 105, such as a buffer memory. M2M descriptors 204B include data that defines the parameters of such a memory transfer. Details regarding at least some of these parameters will be provided below with regard to FIG. 4B.

Operation descriptors 204C specify an operation that neurons 105F in the DNN module 105 should perform on data obtained by a M2M descriptor. For example, operation descriptors 204C can define the arithmetic operations to be performed by neurons 105F such as, but not limited to, additive combining, scalar multiply and add, convolution, deconvolution, max pooling, or a fully connected layer.

Operation descriptors 204C can also specify the activation function to be used by the neurons 105F such as, but not limited to, the ReLU activation function and look-up table-based activation functions, and the mathematical precision to be utilized by the neurons 105F when performing these operations.

Operation descriptors 204C can also include microcode for configuring aspects of the operation of the hardware of the DNN module 105. Operation descriptors 204C can include other fields containing data defining aspects of the configuration of the neurons 105F for implementing a DNN, some of which are described below with reference to FIG. 4A.

Configuration descriptors 204A enable the modification of a configuration state of the DNN module 105. For example, configuration descriptors 204A can be executed to configure how the DNN module 105 performs rounding operations, power management, or enabling and disabling neurons.

Host communication descriptors 204D enable the DNN module 105 to interrupt or signal a host computing device 210 to provide status messages and/or other types of data. For example, the DNN module 105 might execute a host communication descriptor 204D to provide data to a host computing device 210 regarding the status or completion of a layer of a DNN.

Synchronization descriptors 204f can be utilized to synchronize the execution of multiple neurons 105F in the DNN module 105 by instructing the neurons 105F to pause their processing until the other neurons 105F of a neural network have completed their processing. Other types of descriptors can be defined and executed in other embodiments.

Figure 3:
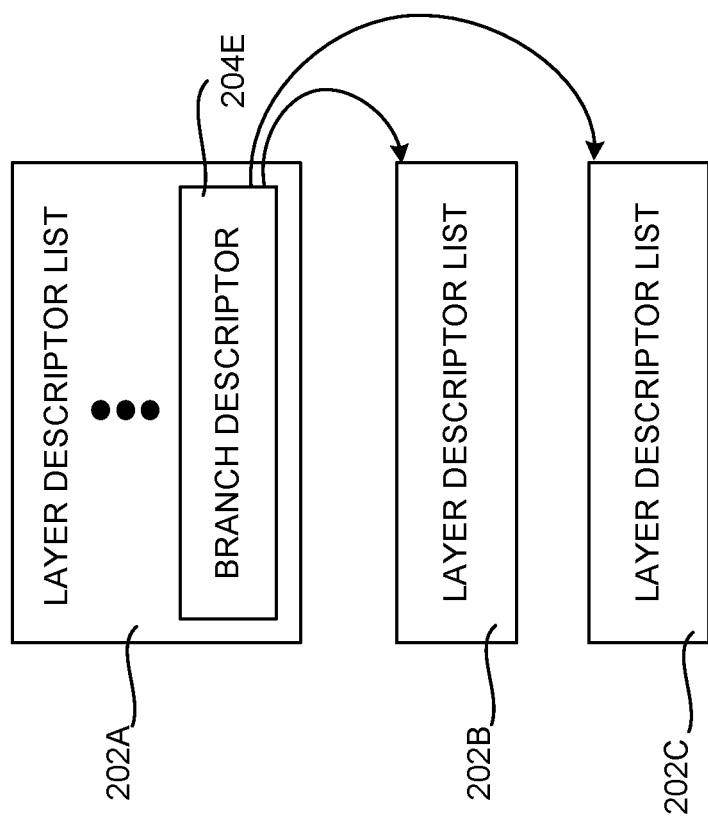
FIG. 3 is a data structure diagram showing additional aspects of the layer descriptor list illustrated in FIG. 2, according to one embodiment.

FIG. 3 is a data structure diagram that shows additional aspects of the layer descriptor list 202 illustrated in FIG. 2, according to one embodiment. In particular, FIG. 3 illustrates aspects of a layer descriptor list 202A that includes a branch descriptor 204E. Branch descriptors 204E enable execution to branch between descriptors 204 or layer descriptor lists 202 when a specified condition is satisfied.

In the example shown in FIG. 3, for instance, a branch descriptor 204E has been defined which, when executed, will branch execution to the head of the layer descriptor list 202B or the head of the layer descriptor list 202C based upon evaluation of a specified condition. Branching the execution of the descriptors 204 can be performed in other ways in other embodiments.

Figure 4A:
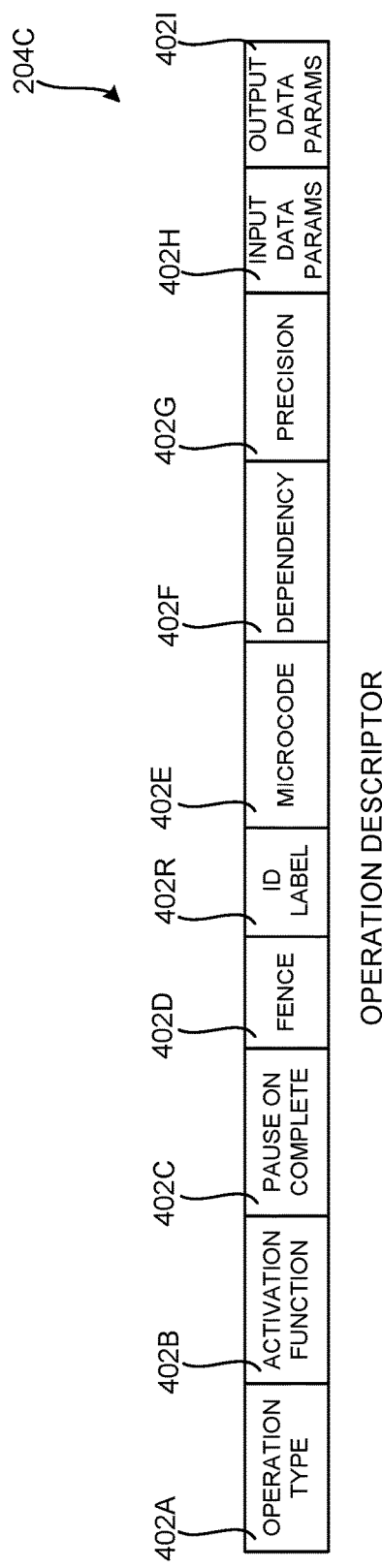
FIG. 4A is a data structure diagram that shows aspects of the configuration of an operation descriptor, according to one embodiment.

FIG. 4A is a data structure diagram that shows aspects of a configuration for an operation descriptor 204C, according to one embodiment. As illustrated in FIG. 4A, an operation descriptor 204C can include fields 402A-402I storing data defining a specific operation that neurons 105F in the DNN module 105 should perform on data obtained by execution of a M2M descriptor 204B. In one embodiment, the operation descriptor 204C is a 128-byte wide data structure that encodes this information. The operation descriptor 204C can be implemented in other ways in other embodiments.

In one embodiment, the operation descriptor 204C includes a field 402A storing data that defines a type of operation to be performed by the neurons 105F such as, but not limited to, additive combining, scalar multiply and add, convolution, deconvolution, max pooling, or a fully connected layer. The operation descriptor 204C can also include a field 402B storing data specifying the activation function to be used by the neurons 105F during the specified processing operation, such as but not limited to the ReLU activation function and look-up table-based activation functions. The operation descriptor 204C can also include a field 402G specifying the mathematical precision to be utilized by the neurons 105F when performing the operation.

Operation descriptors 204C can also include a field 402C that stores data instructing the neurons 105F to pause on completion of their processing. Operation descriptors 204C can also include a field 402D that stores data that will cause the DNN module 105 to prevent further processing of a descriptor 204 until all descriptors 204 ahead of it (i.e. having a lower identification ("ID") label) have completed their processing and received a write response from their completion store (this process might be referred to herein as "fencing"). This can be used to ensure that no other descriptors 204 remain in the descriptor processing pipeline. The ID label is a monotonically increasing number that is assigned to each descriptor 204 based upon the descriptor's placement in a layer descriptor list 202 (i.e. the first descriptor 204 in a descriptor list 202 will have the lowest number). The ID label for operation descriptors 204 is stored in the field 402R in one embodiment.

Operation descriptors 204C can also include a field 402E that embeds microcode for use in configuring aspects of the operation of the hardware of the DNN module 105. For example, and without limitation, the microcode in the field 402E can be extracted by the DNN module 105 and executed to configure the hardware implementing the neurons 105F. As a specific example, the microcode can be executed to configure how convolution operations are to be performed, configure iterators, and/or to configure other aspects of the operation of the neurons 105F.

Operation descriptors 204C can also include a field 402F that stores data defining a dependency upon the completed execution of another descriptor 204. Having a dependency set means that a descriptor will not be executed until the descriptor identified in the field 402F has completed its operation. The field 402F can be set to zero to indicate that a descriptor 204 has no dependencies and that dependency checking should therefore be disabled for that descriptor 204.

In order to enable dependency checking, the DNN module 105 can maintain registers storing the ID label of the most recently completed descriptor. Separate registers can be maintained that identify the most recently completed M2M descriptor 204B and the most recently completed operation descriptor 204C. The DNN module 105 will release dependencies based upon the values stored in these registers.

It is to be appreciated that there may be situations where it is necessary to set dependencies between two M2M descriptors 204B. For example, a dependency must be set between two M2M descriptors 204B when the execution time of one operation is very small and the next operation requires data from the previous operation. It might be necessary to set dependencies between two operation descriptors 204C for similar reasons.

M2M descriptors 204B and operation descriptors 204C can also be dependent upon the completed execution of the other descriptor types identified above. For instance, in the example shown in FIG. 2, execution of the M2M descriptor 204B might be dependent upon the completed execution of the configuration descriptor 204A. Similarly, execution of the host communication descriptor 204D might be dependent upon the completed execution of the second operation descriptor 204C. The different types of descriptors 204 identified above can be dependent upon one another in embodiments disclosed herein.

Operation descriptors 204C can also include a fields 402H and 402I that store data defining aspects of the input data to the operation and the output data (which might be referred to herein as "blobs") generated by the operation. These fields might include, for instance, data identifying memory addresses for the input and output data, the dimensions of the input and output data, precision of the input and output data, feature count, height and width of the input data, channel count, height and width of the output data, padding configuration, and striding configuration. Other aspects of the input and output data can be specified in the operation descriptor 204C in other embodiments.

It is to be appreciated that the fields 402A-402I are merely illustrative. Operation descriptors 204C can include additional or alternative fields in other embodiments that store data defining other aspects of an operation to be performed by the neurons 105F for implementing a DNN.

Figure 4B:
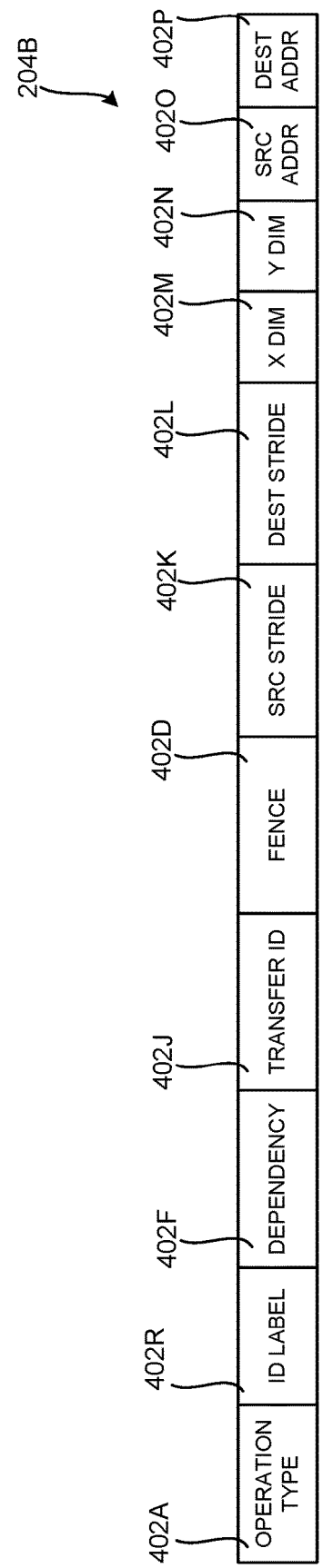
FIG. 4B is a data structure diagram that shows aspects of the configuration of a M2M descriptor, according to one embodiment.

FIG. 4B is a data structure diagram that shows aspects of the configuration of an M2M descriptor 204B, according to one embodiment. As discussed above, M2M descriptors 204B include fields specifying parameters that define a multi-dimensional strided DMA operation to and from any memory address. In one embodiment, the M2M descriptor 204B is a 128-byte wide data structure that encodes this information. The M2M descriptor 204B can be implemented in other ways in other embodiments.

In one embodiment, the M2M descriptor 204B includes a field 402A indicating that the descriptor is a M2M descriptor 204B. The M2M descriptor 204B can also include a field 402R storing an ID label such as that described above for the M2M descriptor 204B. The M2M descriptor 204B can also include a field 402F specifying a dependency upon the completed execution of another descriptor 204, also in the manner described above. Similarly, the M2M descriptor 204B can include a field 402D that stores data that will cause the DNN module 105 to prevent further processing of the descriptor 204B until all descriptors 204 ahead of it have completed their processing and received a write response from their completion store (i.e. the fencing operation described above).

The M2M descriptor 204B can also include a field 402J specifying a user-defined transfer ID. By storing a unique number in this field and monitoring the corresponding field in an operation status register of the DNN module 105, software can identify the currently executing transfer.

The M2M descriptor 204B can also include fields 402K-402P specifying aspects of the data to be transferred. For example, and without limitation, these fields can store data identifying a source stride (i.e. the number of bytes between the first bytes of consecutive rows of a DMA transfer), destination stride, size of the operation in the X and Y dimensions, source memory address, and destination memory address, respectively. M2M descriptors 204B can include additional or alternative fields in other embodiments that store data defining other aspects of an M2M operation.

Figure 5:
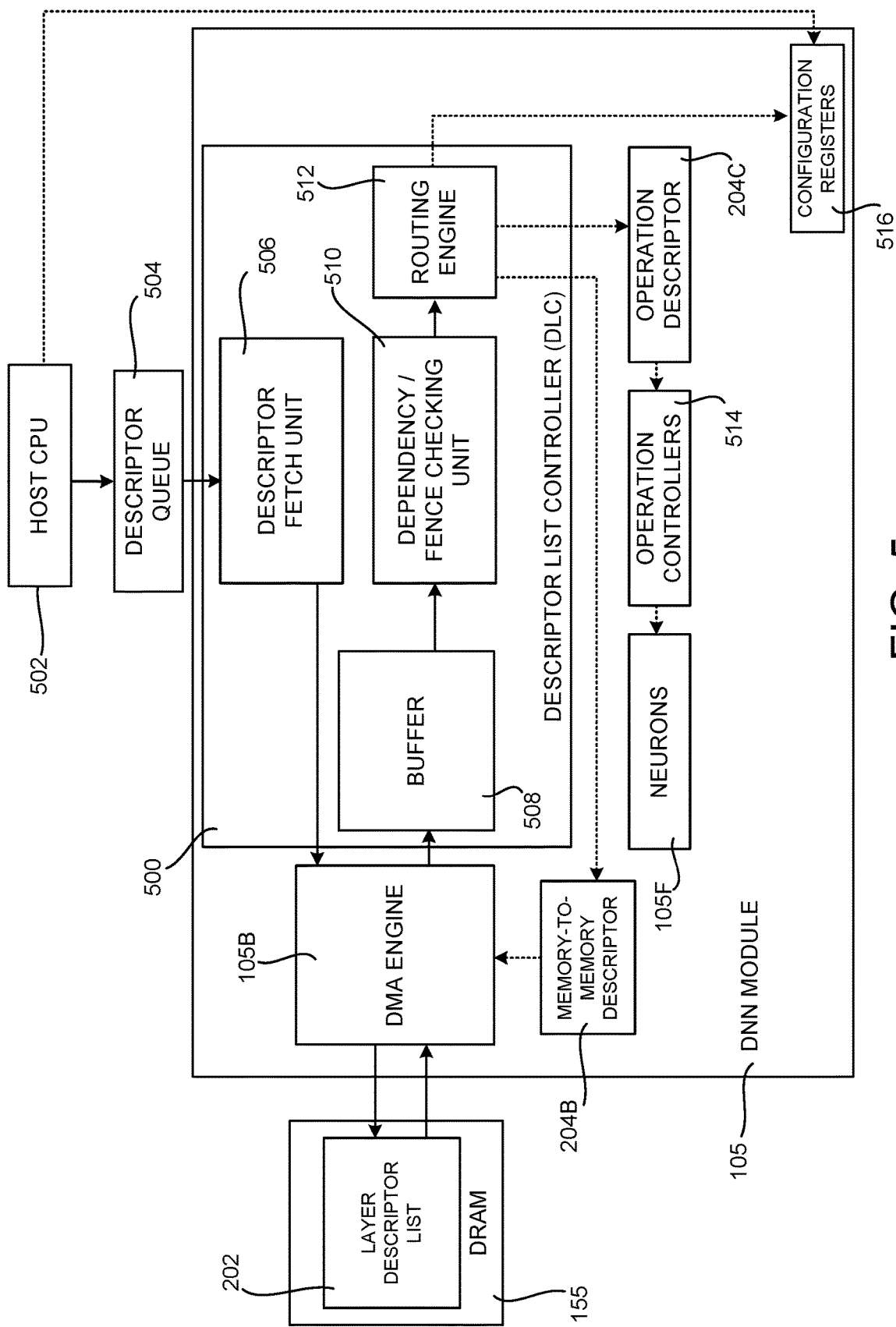
FIG. 5 is a computing architecture diagram that shows details regarding the configuration of a DNN module capable of executing descriptors in a layer descriptor list, according to one embodiment.

FIG. 5 is a computing architecture diagram that shows details regarding the configuration of a DNN module 105 configured to execute descriptors 204 in a layer descriptor list 202, according to one embodiment. In this embodiment, the DNN module 105 includes a descriptor list controller ("DLC") 500 that performs operations for retrieving and routing descriptors 204 in a layer descriptor list 202.

As illustrated in FIG. 5, a host CPU 502 (i.e. a CPU in the host computing device 210) provides the DLC 500 with data identifying a layer descriptor list 202 to be executed. This data is stored in a descriptor queue 504 in one embodiment. A descriptor fetch unit 506, in turn, retrieves the data from the descriptor queue 504 and instructs the DMA engine 105B to retrieve the identified layer descriptor list 202. The DMA engine 105B retrieves the layer descriptor list 202 from the DRAM 155 of the host computer 210 and stores the layer descriptor list 202 in a buffer 508 provided by the DLC 500.

In some embodiments, a dependency/fence checking unit 510 retrieves descriptors 204 from the buffer 508 and enforces the fence and dependency checks described above. Following processing by the dependency/fence checking unit 510, descriptors 204 in the layer descriptor list 202 are provided to a routing engine 512.

The routing engine 512 routes different types of descriptors to different pipelines. For instance, in the example shown in FIG. 5, the routing engine 512 has routed a M2M descriptor 204B to the DMA engine 105B. As discussed above, the DMA engine 105B can utilize the contents of the M2M descriptor 204B to transfer input data and weight data to be operated on by neurons 105F in the DNN module 105 from a memory of the host computing device 210 to a memory in the DNN module 105, such as a buffer.

In the example shown in FIG. 5, the routing engine 512 has also routed an operation descriptor 204C to the operation controllers 514 for execution. The operation controllers 514 will utilize the operation descriptor 204C to configure the neurons 105F. Once configured, the neurons 105F can process the data retrieved through the execution of the M2M descriptor 204B. This process can be repeated for additional descriptors 204 such as those described above, and additional layer descriptor lists 202.

As also shown in FIG. 5, the routing engine 512 can utilize configuration descriptors 204A to set the state of the configuration registers 516, which define the configuration for the DNN module 105. As also shown in FIG. 5, the host CPU 502 can also independently access the configuration registers 516 to set or retrieve the configuration state of the DNN module 105. For example, the host CPU 502 might set the configuration registers 516 in a manner that causes the DNN module 105 to power itself down following completion of DNN processing. The host CPU 502 can utilize the configuration registers 516 to set other aspects of the configuration state of the DNN module 105 in other embodiments. The registers 516 can be outside of a power island containing the DNN module 105 in order to allow the host 210 to access the registers 516 when the DNN module 105 is powered down.

As discussed above, the DLC 500 buffers M2M descriptors 204B separately from operation descriptors 204C. In this manner, the M2M descriptors 204B can be executed as soon as possible, subject to explicitly set dependencies. As a result, the latency typically incurred in obtaining data for processing by neurons 105F in the DNN module 105 can be reduced and, consequently, the neurons 105F can complete their processing faster than they otherwise would have. The DNN module 105 can then be powered down earlier than it otherwise would have, thereby saving power. Other technical benefits not specifically identified herein can also be realized through implementations of the disclosed technologies.

Figure 6:
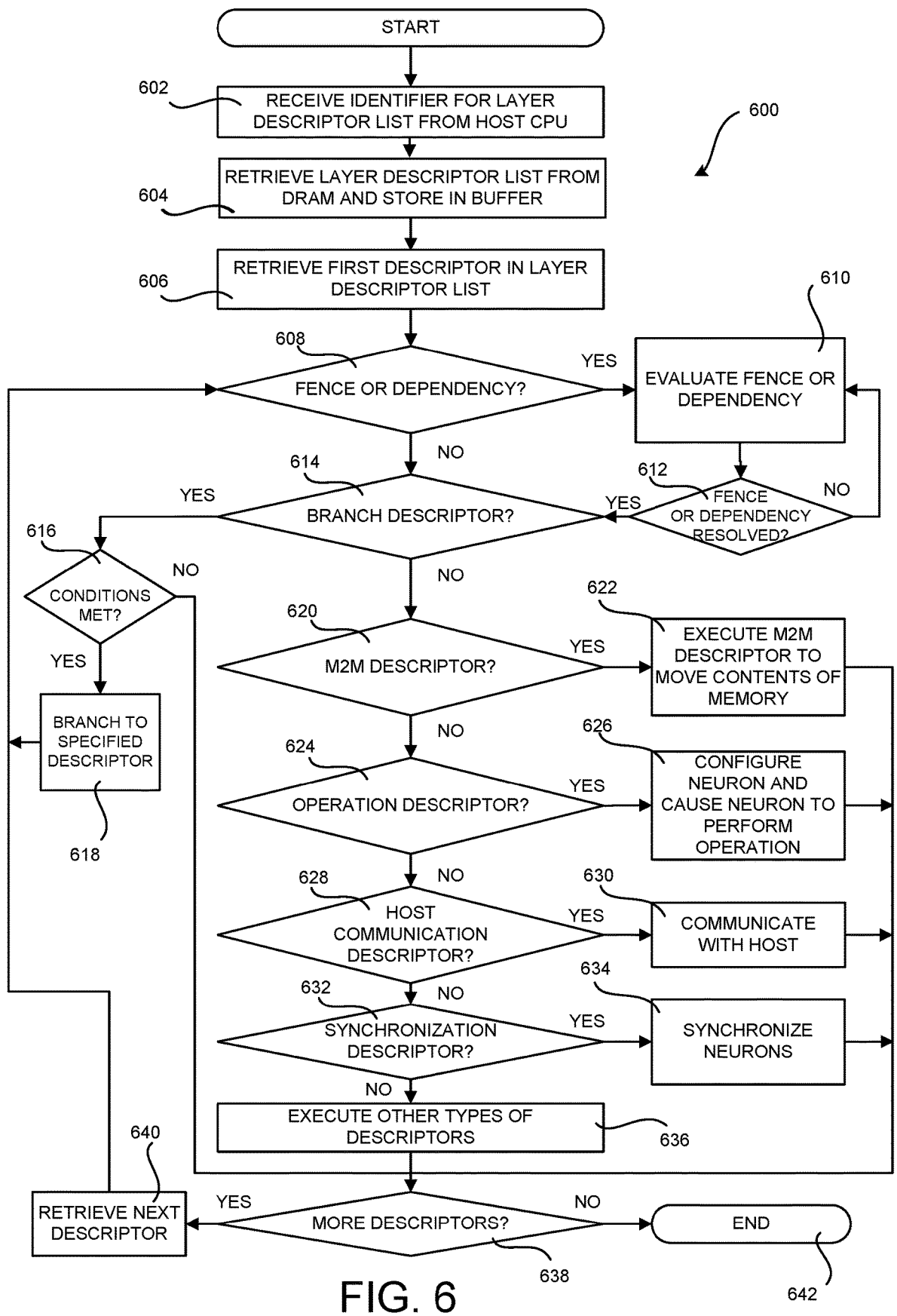
FIG. 6 is a flow diagram showing a routine that illustrates aspects of the operation of the DNN module described with reference to FIGS. 1-5 for executing descriptors in a layer descriptor list, according to one embodiment disclosed herein.

FIG. 6 is a flow diagram showing a routine 600 that illustrates aspects of the operation of the DNN module 105 described with reference to FIGS. 1-5 for executing descriptors 204 in a layer descriptor list 202, according to one embodiment disclosed herein. It should be appreciated that the logical operations described herein with regard to FIG. 6, and the other FIGS., can be implemented (1) as a sequence of computer implemented acts or program modules running on a computing device and/or (2) as interconnected machine logic circuits or circuit modules within a computing device such as the DNN module 105.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 600 begins at operation 602, where the DLC 500 receives data from the host CPU 502 describing the location of a descriptor list 202 in the host DRAM 155. This data is placed in the descriptor queue 504. The routine 600 then proceeds from operation 602 to operation 604, where the descriptor fetch unit 506 instructs the DMA engine 105B to retrieve the layer descriptor list 202 from the host DRAM 155. The DMA engine 105B, in turn, retrieves the layer descriptor list 202 and stores the list 202 in the buffer 508. The routine 600 then proceeds from operation 604 to operation 606.

At operation 606, the first descriptor 204 in the descriptor list 202 is retrieved from the buffer 508. The routine 600 then proceeds to operation 608, where the dependency/fence checking unit 510 determines whether the descriptor 204 indicates a fence or dependency. If so, the routine 600 proceeds from operation 608 to operation 610, where the dependency/fence checking unit 510 determines if the specified fence or dependency condition, or conditions, has been satisfied. If so, the routine 600 branches from operation 612 to operation 614.

If, at operation 608, the dependency/fence checking unit 510 determines that the descriptor 204 does not indicate a fence or dependency, the routine 600 proceeds from operation 608 to operation 614. At operation 614, the routing engine 512 determines whether the current descriptor 204 is a branch descriptor 204E. If so, the routine 600 proceeds from operation 614 to operation 616, where a determination is made as to whether the condition specified by the branch descriptor 204E has been met. If so, the routine 600 proceeds from operation 616 to operation 618, where execution of the descriptors 204 branches to the descriptor 204 identified by the branch descriptor 204E. The routine 600 then proceeds from operation 618 back to operation 608, where the next descriptor 204 can be processed.

If, at operation 614, the routing engine 512 determines that the current descriptor 204 is not a branch descriptor 204E, the routine 600 proceeds from operation 614 to operation 620. At operation 620, the routing engine 512 determines if the current descriptor 204 is a M2M descriptor 204B. If so, the routine 600 proceeds from operation 614 to operation 622, where the routing engine 512 routes the current descriptor 204B to the DMA engine 105B in order to perform the specified M2M operation. If the current descriptor 204 is not a M2M descriptor 204B, the routine 600 proceeds from operation 620 to operation 624.

At operation 624, the routing engine 512 determines if the current descriptor 204 is an operation descriptor 204C. If so, the routine 600 proceeds from operation 624 to operation 626, where the routing engine 512 routes the current descriptor 204C to the operation controllers 514 in order to configure the neurons 105F and perform the processing operation specified by the operation descriptor 204C. If the current descriptor 204 is not an operation descriptor 204C, the routine 600 proceeds from operation 624 to operation 628.

At operation 628, the routing engine 512 determines if the current descriptor 204 is a host communication descriptor 204D. If so, the routine 600 proceeds from operation 628 to operation 630, where the host 210 can be interrupted or signaled in another manner in order to transmit data from the DNN module 104 to the host 210. If the current descriptor 204 is not a host communication descriptor 204D, the routine 600 proceeds from operation 628 to operation 632.

At operation 632, the routing engine 512 determines if the current descriptor 204 is a synchronization descriptor. If so, the routine 600 proceeds from operation 632 to operation 634, where operation controllers 514 synchronize the neurons 105F in the manner described above. If the current descriptor 204 is not synchronization descriptor, the routine 600 proceeds from operation 632 to operation 636, where other descriptor types can be executed. The routine 600 then proceeds from operation 636 to operation 638.

At operation 638, the DLC 500 determines if there are additional descriptors 204 in the descriptor list 202 to be executed. If not, the routine 600 proceeds from operation 638 to operation 642, where it ends. If additional descriptors 204 remain to be processed, the routine 600 proceeds from operation 638 to operation 640, where the next descriptor 204 in the descriptor list 202 is retrieved. The routine 600 then proceeds back to operation 608, where the descriptor 204 can be processed in the manner described above.

Figure 7:
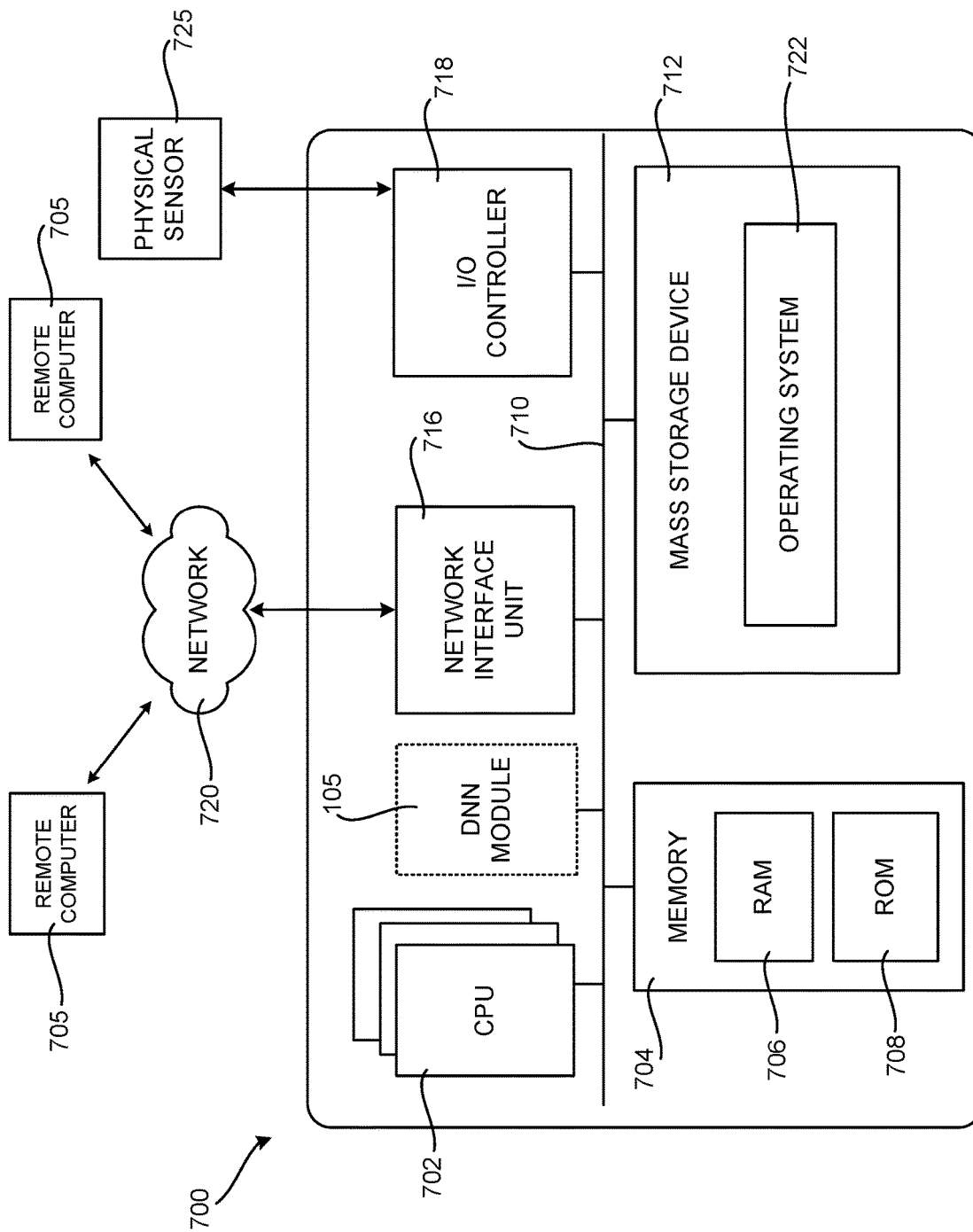
FIG. 7 is a computer architecture diagram showing an illustrative computer hardware and software architecture for a computing device that can act as an application host for the DNN module presented herein, according to one embodiment.

FIG. 7 is a computer architecture diagram showing an illustrative computer hardware and software architecture for a computing device that can act as an application host for the DNN module 105 presented herein. In particular, the architecture illustrated in FIG. 7 can be utilized to implement a server computer, mobile phone, an e-reader, a smartphone, a desktop computer, an AR/VR device, a tablet computer, a laptop computer, or another type of computing device suitable for use with the DNN module 105.

The computer 700 illustrated in FIG. 7 includes a central processing unit 702 ("CPU"), a system memory 704, including a random-access memory 706 ("RAM") and a read-only memory ("ROM") 708, and a system bus 710 that couples the memory 704 to the CPU 702. A basic input/output system ("BIOS" or "firmware") containing the basic routines that help to transfer information between elements within the computer 700, such as during startup, can be stored in the ROM 708. The computer 700 further includes a mass storage device 712 for storing an operating system 722, application programs, and other types of programs. The mass storage device 712 can also be configured to store other types of programs and data.

The mass storage device 712 is connected to the CPU 702 through a mass storage controller (not shown) connected to the bus 710. The mass storage device 712 and its associated computer readable media provide non-volatile storage for the computer 700. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 700.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 700. For purposes of the claims, the phrase "computer storage medium," and variations thereof, does not include waves or signals per se or communication media.

According to various configurations, the computer 700 can operate in a networked environment using logical connections to remote computers through a network such as the network 720. The computer 700 can connect to the network 720 through a network interface unit 716 connected to the bus 710. It should be appreciated that the network interface unit 716 can also be utilized to connect to other types of networks and remote computer systems. The computer 700 can also include an input/output controller 718 for receiving and processing input from a number of other devices, including a keyboard, mouse, touch input, an electronic stylus (not shown in FIG. 7), or a physical sensor such as a video camera. Similarly, the input/output controller 718 can provide output to a display screen or other type of output device (also not shown in FIG. 7).

It should be appreciated that the software components described herein, when loaded into the CPU 702 and executed, can transform the CPU 702 and the overall computer 700 from a general-purpose computing device into a special-purpose computing device customized to facilitate the functionality presented herein. The CPU 702 can be constructed from any number of transistors or other discrete circuit elements, which can individually or collectively assume any number of states. More specifically, the CPU 702 can operate as a finite-state machine, in response to executable instructions contained within the software modules disclosed herein. These computer-executable instructions can transform the CPU 702 by specifying how the CPU 702 transitions between states, thereby transforming the transistors or other discrete hardware elements constituting the CPU 702.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 700 in order to store and execute the software components presented herein. It also should be appreciated that the architecture shown in FIG. 7 for the computer 700, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 700 might not include all of the components shown in FIG. 7, can include other components that are not explicitly shown in FIG. 7, or can utilize an architecture completely different than that shown in FIG. 7.

Figure 8:
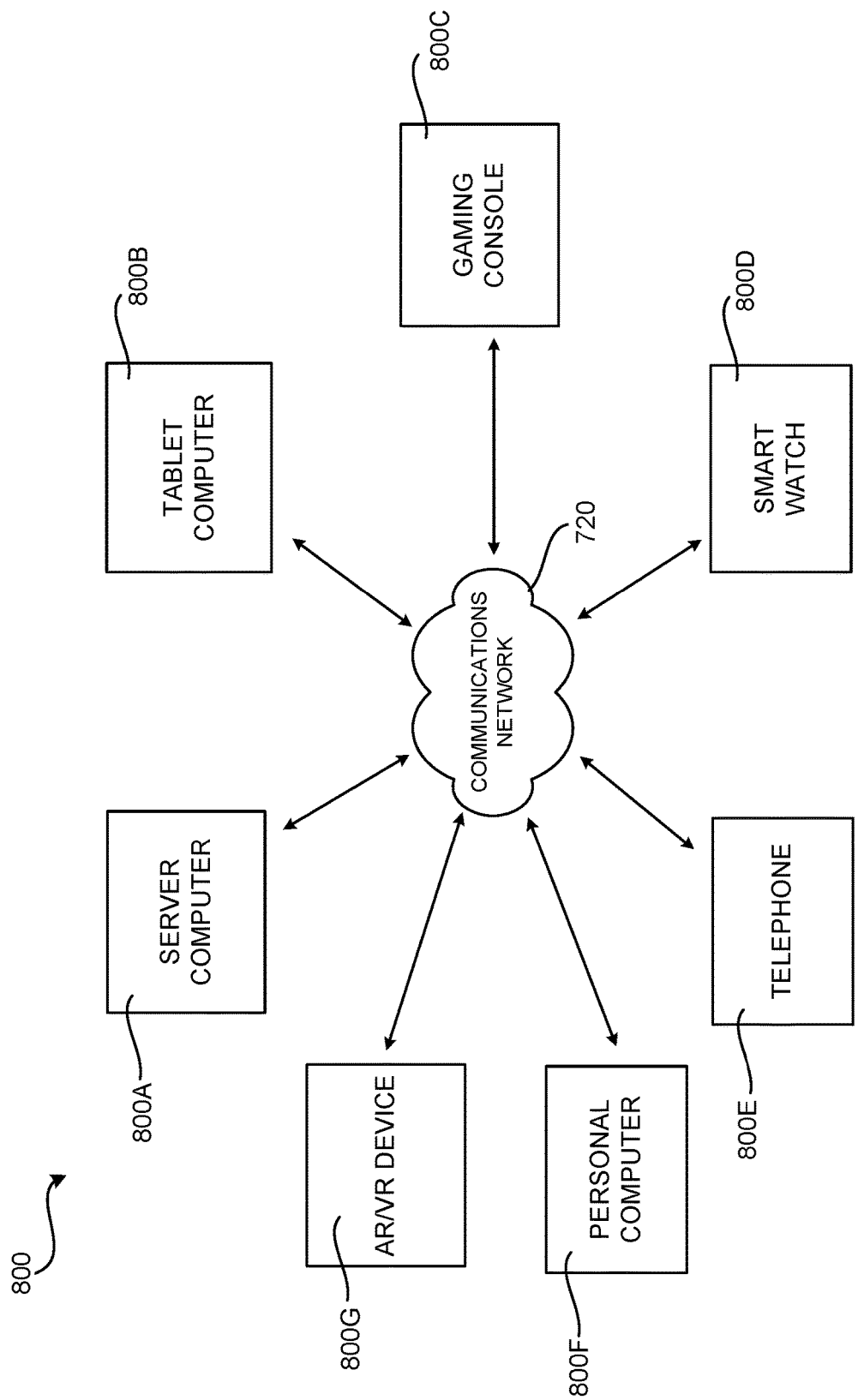
FIG. 8 is a network diagram illustrating a distributed computing environment in which aspects of the disclosed technologies can be implemented, according to various embodiments presented herein.

FIG. 8 is a network diagram illustrating a distributed network computing environment 800 in which aspects of the disclosed technologies can be implemented, according to various embodiments presented herein. As shown in FIG. 8, one or more server computers 800A can be interconnected via a communications network 720 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 800B, a gaming console 800C, a smart watch 800D, a telephone 800E, such as a smartphone, a personal computer 800F, and an AR/VR device 800G.

In a network environment in which the communications network 720 is the Internet, for example, the server computer 800A can be a dedicated server computer operable to process and communicate data to and from the client computing devices 800B-800G via any of a number of known protocols, such as, hypertext transfer protocol ("HTTP"), file transfer protocol ("FTP"), or simple object access protocol ("SOAP"). Additionally, the networked computing environment 800 can utilize various data security protocols such as secured socket layer ("SSL") or pretty good privacy ("PGP"). Each of the client computing devices 800B-800G can be equipped with an operating system operable to support one or more computing applications or terminal sessions such as a web browser (not shown in FIG. 8), or other graphical user interface (not shown in FIG. 8), or a mobile desktop environment (not shown in FIG. 8) to gain access to the server computer 800A.

The server computer 800A can be communicatively coupled to other computing environments (not shown in FIG. 8) and receive data regarding a participating user's interactions/resource network. In an illustrative operation, a user (not shown in FIG. 8) may interact with a computing application running on a client computing device 800B-800G to obtain desired data and/or perform other computing applications.

The data and/or computing applications may be stored on the server 800A, or servers 800A, and communicated to cooperating users through the client computing devices 800B-800G over an exemplary communications network 720. A participating user (not shown in FIG. 8) may request access to specific data and applications housed in whole or in part on the server computer 7800A. These data may be communicated between the client computing devices 800B-800G and the server computer 800A for processing and storage.

The server computer 800A can host computing applications, processes and applets for the generation, authentication, encryption, and communication of data and applications, and may cooperate with other server computing environments (not shown in FIG. 8), third party service providers (not shown in FIG. 8), network attached storage ("NAS") and storage area networks ("SAN") to realize application/data transactions.

It should be appreciated that the computing architecture shown in FIG. 7 and the distributed network computing environment shown in FIG. 8 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A neural network processor, comprising: one or more neurons; a first memory device storing a layer descriptor list comprising at least one memory-to-memory (M2M) descriptor, and at least one operation descriptor; a second memory device for storing data to be operated on by the one or more neurons; and a controller configured to execute the at least one M2M descriptor to perform a M2M operation to transfer the data to be operated on by the one or more neurons from a memory of a host computing device to the second memory device, and execute the at least one operation descriptor stored in the first memory device to cause the one or more neurons to perform an operation on the data in the second memory device.

Clause 2. The neural network processor of clause 1, wherein the at least one operation descriptor comprises a field specifying the operation to be performed by the one or more neurons, and wherein the operation comprises an additive combining operation, a scalar multiply and add operation, a convolution operation, a deconvolution operation, a max pooling operation, or a fully connected layer operation.

Clause 3. The neural network processor of any of clauses 1 and 2, wherein the at least one operation descriptor comprises a field specifying a type of activation function to be used by the one or more neurons during the operation.

Clause 4. The neural network processor of any of clauses 1-3, wherein the layer descriptor list further comprises a branch descriptor which, when executed, will cause the controller to: determine if a condition has been satisfied; and responsive to determining the condition has been satisfied, cause execution of descriptors in the layer descriptor list to branch from a first descriptor to a second descriptor.

Clause 5. The neural network processor of any of clauses 1-4, wherein the layer descriptor list further comprises a synchronization descriptor which, when executed by the controller, will cause the controller to synchronize the one or more neurons.

Clause 6. The neural network processor of any of clauses 1-5, wherein the layer descriptor list further comprises a configuration descriptor which, when executed by the controller, modifies a configuration state of the neural network module.

Clause 7. The neural network processor of any of clauses 1-6, wherein the layer descriptor list further comprises a host communication descriptor which, when executed by the controller, will cause the controller to transmit data to the host computing device.

Clause 8. A computer-implemented method, comprising: storing a layer descriptor list in a memory of a neural network module, the layer descriptor list comprising at least one memory-to-memory (M2M) descriptor, and at least one operation descriptor; executing the at least one M2M descriptor by way of the neural network module to perform a M2M operation for obtaining the data to be operated on by the one or more neurons from a memory of a host computing device; and executing the at least one operation descriptor by way of the neural network module to cause the one or more neurons to perform an operation on the data.

Clause 9. The computer-implemented method of clause 8, wherein the at least one operation descriptor comprises a field specifying the operation to be performed on the data by the one or more neurons, and wherein the operation comprises an additive combining operation, a scalar multiply and add operation, a convolution operation, a deconvolution operation, a max pooling operation, or a fully connected layer operation.

Clause 10. The computer-implemented method of any of clauses 8 and 9, wherein the at least one operation descriptor comprises a field specifying a type of activation function to be used by the one or more neurons.

Clause 11. The computer-implemented method of any of clauses 8-10, wherein the at least one operation descriptor comprises a field specifying a mathematical precision to be utilized by the operation.

Clause 12. The computer-implemented method of any of clauses 8-11, wherein the at least one operation descriptor comprises microcode for configuring the neural network module for performing the operation.

Clause 13. The computer-implemented method of any of clauses 8-12, wherein the layer descriptor list further comprises a host communication descriptor which, when executed by the controller, will cause the controller to interrupt or signal the host computing device and transmit data to the host computing device.

Clause 14. The computer-implemented method of any of clauses 8-13, wherein the layer descriptor list further comprises a branch descriptor which, when executed, will cause the neural network module to: determine if a condition has been satisfied; and responsive to determining the condition has been satisfied, cause execution of descriptors in the layer descriptor list to branch from a first descriptor to a second descriptor.

Clause 15. A neural network processor, comprising: one or more neurons; a first memory device storing a layer descriptor list comprising an ordered list of descriptors defining configurations for layers of a neural network; and a controller configured to execute a first descriptor in the layer descriptor list to obtain data to be operated on by the one or more neurons, and execute a second descriptor in the layer descriptor list to cause the one or more neurons to perform an operation on the data.

Clause 16. The neural network processor of clause 15, wherein the first descriptor comprises a field specifying the operation, and wherein the operation comprises an additive combining operation, a scalar multiply and add operation, a convolution operation, a deconvolution operation, a max pooling operation, or a fully connected layer operation.

Clause 17. The neural network processor of any of clauses 15 and 16, wherein the first descriptor comprises a field specifying a type of activation function to be used by the one or more neurons.

Clause 18. The neural network processor of any of clauses 15-17, wherein the layer descriptor list further comprises a descriptor which, when executed by the controller, will cause the controller to: determine if a condition has been satisfied; and branch the execution of the descriptors in the layer descriptor list responsive to determining the condition has been satisfied.

Clause 19. The neural network processor of any of clauses 15-18, wherein the layer descriptor list further comprises a descriptor which, when executed by the controller, modifies a configuration state of the neural network module.

Clause 20. The neural network processor of any of clauses 15-19, wherein the layer descriptor list further comprises a descriptor which, when executed by the controller, will cause the controller to synchronize the one or more neurons.

Based on the foregoing, it should be appreciated that a neural network module that can execute descriptors in a layer descriptor list to efficiently perform DNN calculations has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A neural network processor, comprising:
one or more neurons;
a first memory device storing a layer descriptor list defining configurations for layers of the neural network processor, the layer descriptor list comprising
at least one memory-to-memory (M2M) descriptor, and
at least one operation descriptor;
a second memory device for storing data to be operated on by the one or more neurons; and
a controller configured to
retrieve the layer descriptor list and configuring at least one of the one or more neurons based on the layer descriptor list;
execute the at least one M2M descriptor to perform a M2M operation to transfer the data to be operated on by the one or more neurons from a memory of a host computing device to the second memory device, and
execute the at least one operation descriptor stored in the first memory device to cause the one or more neurons to perform an operation on the data in the second memory device.

2. The neural network processor of claim 1, wherein the at least one operation descriptor comprises a field specifying the operation to be performed by the one or more neurons, and wherein the operation comprises
an additive combining operation,
a scalar multiply and add operation,
a convolution operation,
a deconvolution operation,
a max pooling operation, or
a fully connected layer operation.

3. The neural network processor of claim 1, wherein the at least one operation descriptor comprises a field specifying a type of activation function to be used by the one or more neurons during the operation.

4. The neural network processor of claim 1, wherein the layer descriptor list further comprises a branch descriptor which, when executed, will cause the controller to:
determine if a condition has been satisfied; and
responsive to determining the condition has been satisfied, cause execution of descriptors in the layer descriptor list to branch from a first descriptor to a second descriptor.

5. The neural network processor of claim 1, wherein the layer descriptor list further comprises a synchronization descriptor which, when executed by the controller, will cause the controller to synchronize the one or more neurons.

6. The neural network processor of claim 1, wherein the layer descriptor list further comprises a configuration descriptor which, when executed by the controller, modifies a configuration state of the neural network processor.

7. The neural network processor of claim 1, wherein the layer descriptor list further comprises a host communication descriptor which, when executed by the controller, will cause the controller to transmit data to the host computing device.

8. A computer-implemented method, comprising:
storing a layer descriptor list in a memory of a neural network module, the layer descriptor list defining configurations for layers of a deep neural network, the layer descriptor list comprising
at least one memory-to-memory (M2M) descriptor, and
at least one operation descriptor;
retrieving the layer descriptor list and configuring at least one neuron of the neural network module based on the layer descriptor list;
executing, by the at least one neuron, the at least one M2M descriptor of the retrieved layer descriptor list to perform a M2M operation for obtaining data to be operated on by the one or more neurons from a memory of a host computing device; and
executing, by the at least one neuron, the at least one operation descriptor by way of the neural network module to cause the one or more neurons to perform an operation on the data.

9. The computer-implemented method of claim 8, wherein the at least one operation descriptor comprises a field specifying the operation to be performed on the data by the one or more neurons, and wherein the operation comprises
an additive combining operation,
a scalar multiply and add operation,
a convolution operation,
a deconvolution operation,
a max pooling operation, or
a fully connected layer operation.

10. The computer-implemented method of claim 8, wherein the at least one operation descriptor comprises a field specifying a type of activation function to be used by the one or more neurons.

11. The computer-implemented method of claim 8, wherein the at least one operation descriptor comprises a field specifying a mathematical precision to be utilized by the operation.

12. The computer-implemented method of claim 8, wherein the at least one operation descriptor comprises microcode for configuring the neural network module for performing the operation.

13. The computer-implemented method of claim 8, wherein the layer descriptor list further comprises a host communication descriptor which, when executed by the controller, will cause the controller to interrupt or signal the host computing device and transmit data to the host computing device.

14. The computer-implemented method of claim 8, wherein the layer descriptor list further comprises a branch descriptor which, when executed, will cause the neural network module to:
determine if a condition has been satisfied; and
responsive to determining the condition has been satisfied, cause execution of descriptors in the layer descriptor list to branch from a first descriptor to a second descriptor.

15. A neural network processor, comprising:
one or more neurons;
a first memory device storing a layer descriptor list comprising an ordered list of descriptors defining configurations for layers of a neural network; and a controller configured to
- execute a first descriptor in the layer descriptor list to obtain data to be operated on by the one or more neurons, and
- execute a second descriptor in the layer descriptor list to cause the one or more neurons to perform an operation on the data.

16. The neural network processor of claim 15, wherein the first descriptor comprises a field specifying the operation, and wherein the operation comprises
- an additive combining operation,
- a scalar multiply and add operation,
- a convolution operation,
- a deconvolution operation,
- a max pooling operation, or
- a fully connected layer operation.

17. The neural network processor of claim 15, wherein the first descriptor comprises a field specifying a type of activation function to be used by the one or more neurons.

18. The neural network processor of claim 15, wherein the layer descriptor list further comprises a descriptor which, when executed by the controller, will cause the controller to:
- determine if a condition has been satisfied; and
- branch the execution of the descriptors in the layer descriptor list responsive to determining the condition has been satisfied.

19. The neural network processor of claim 15, wherein the layer descriptor list further comprises a descriptor which, when executed by the controller, modifies a configuration state of the neural network processor.

20. The neural network processor of claim 15, wherein the layer descriptor list further comprises a descriptor which, when executed by the controller, will cause the controller to synchronize the one or more neurons.

* * * * *